United States Patent [19]

Crisp

[11] 4,380,707

[45] Apr. 19, 1983

[54] TRANSISTOR-TRANSISTOR LOGIC INPUT BUFFER CIRCUIT WITH POWER SUPPLY/TEMPERATURE EFFECTS COMPENSATION CIRCUIT

[75] Inventor: Richard D. Crisp, Austin, Tex.

[73] Assignee: Motorola, Inc., Schaumburg, Ill.

[21] Appl. No.: 150,536

[22] Filed: May 16, 1980

[51] Int. Cl.³ .................. G05F 1/56; H03K 17/687; H03K 19/003; H03K 19/094

[52] U.S. Cl. .................. 307/443; 307/448; 307/297; 307/310; 323/313; 330/277

[58] Field of Search ............. 307/200 B, 443, 549, 307/550, 574, 296, 297; 330/277, 254; 323/313, 312

[56] References Cited

U.S. PATENT DOCUMENTS

| | | | |
|---|---|---|---|
| 3,746,946 | 7/1973 | Clark | 307/200 B |
| 3,970,875 | 7/1976 | Leehan | 307/304 |
| 3,975,649 | 8/1976 | Kawagoe et al. | 307/297 |
| 4,135,125 | 1/1979 | Oura | 307/297 |
| 4,267,501 | 5/1981 | Smith | 323/313 |

Primary Examiner—John S. Heyman
Attorney, Agent, or Firm—Anthony J. Sarli, Jr.; Vincent B. Ingrassia

[57] ABSTRACT

An MOS input buffer circuit for receiving transistor transistor logic (T²L) logic level input signal includes a plurality of inverting amplifier stages. The input signal is applied to the gate electrode of a first field effect transistor in the first inverter stage and may assume a high logic level of as low as 2 volts and a low logic level of as high as 0.8 volts. In order to provide a stable switching point at the output of the first inverter stage, a feedback field effect transistor is coupled between the output of the first inverter stage and ground and has its gate electrodes coupled to a source of supply voltage ($V_{DD}$). As $V_{DD}$ increases, the feedback field effect transistor will sink more current and thus alter the gain of the first amplifying stage to stabilize its switch point. To further enhance the tracking capabilities over temperature and process variations, the first two inverter stages are comprised entirely of field effect transistors of the enhancement type and having substantially equal channel lengths.

2 Claims, 3 Drawing Figures 4,380,707

TRANSISTOR-TRANSISTOR LOGIC INPUT BUFFER CIRCUIT WITH POWER SUPPLY/TEMPERATURE EFFECTS COMPENSATION CIRCUIT

BACKGROUND OF THE INVENTION

1. Field of the Invention

This invention relates generally to MOS very large scale integrated (VLSI) circuits and, more particularly, to an MOS transistor-transistor logic (T²L) input buffer circuit having a more stabilized switching point over variations in supply voltage, temperature and process parameters.

2. Description of the Prior Art

The advantages offered by NMOS technology are well known; e.g. higher density, greater yield, etc. The smaller NMOS device geometries permit a greater number of devices to be produced per unit area, or, stated another way, a single device will occupy less space. This characteristic is extremely important in the design and fabrication of complex digital integrated circuits; for example, single chip microprocessors. However, it is often necessary for such MOS circuitry to interface with other electronic circuitry fabricated in accordance with different technologies; e.g. T²L.

T²L output signals are generally representative of logic zero and logic one states. A T²L logic one state may be represented by a voltage as low as two volts, and a T²L logic zero level may be represented by a voltage of as much as 0.8 volts. Due to this relatively low input voltage swing, variations in switching points due to variations in the supply voltage ($V_{DD}$), temperature and process variations could result in nonrecognition by the buffer circuit of an input voltage transition.

SUMMARY OF THE INVENTION

It is an object of the present invention to provide an improved buffer circuit.

It is a further object of the present invention to provide an improved MOS buffer circuit having a stable switching point over process, temperature and supply voltage variations.

It is a still further object of the present invention to provide an improved MOS input buffer circuit employing feedback means for modifying the gain and therefore the switching point of the buffer circuit.

It is yet another object of the present invention to provide an improved MOS input buffer circuit for receiving T²L logic level signals.

Finally, it is an object of the present invention to provide an MOS input buffer circuit for receiving T²L logic level signals which employs a plurality of inverting amplifier stages each comprised of enhancement devices wherein each of said devices has a matched channel length.

According to an aspect of the invention there is provided an MOS input buffer circuit, comprising: a first amplifying stage coupled to a source of supply voltage and having a first input and a first output, said first input for receiving an input signal representative of high and low logic levels; at least one additional amplifying stage coupled to said source and having a second input coupled to said first output and having a second output; and means coupled to said source and to said first amplifying stage for altering the gain of said first amplifying stage in response to fluctuations in said supply voltage.

The above and other objects, features and advantages of the present invention will be more clearly understood from the following detailed description taken in conjunction with the accompanying drawings, in which:

DESCRIPTION OF THE PREFERRED EMBODIMENT

Figure 1A:
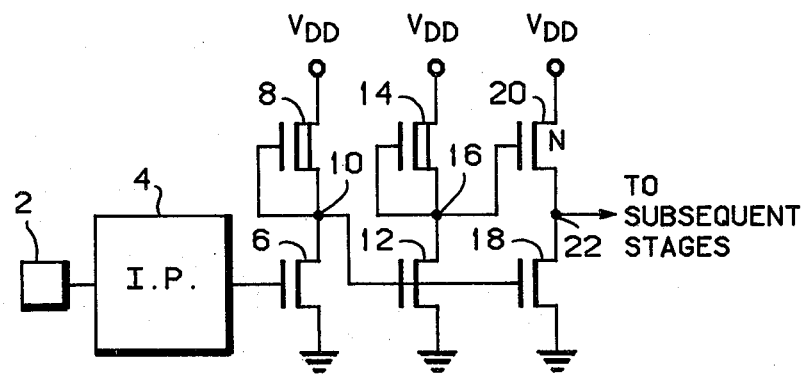
FIG. 1A is a schematic diagram of a known MOS buffer circuit.
Figure 1B:
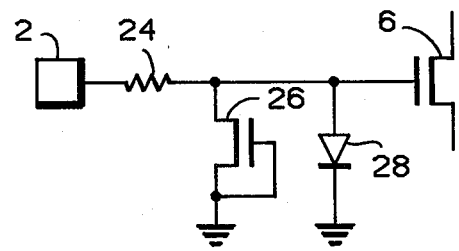
FIG. 1B is a schematic diagram of input protection circuitry.
Figure 2:
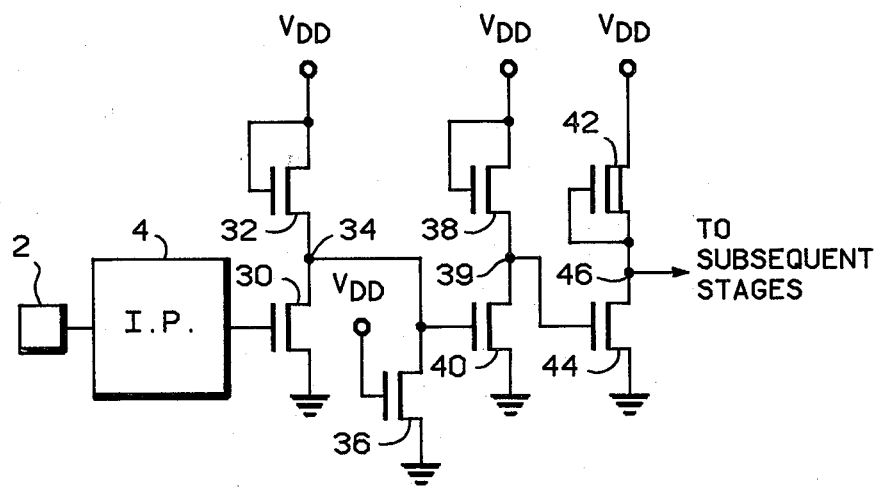
FIG. 2 is a schematic diagram of the inventive MOS input buffer circuit for receiving T²L logic level signals.

Before embarking on a discussion of the circuits shown in FIGS. 1A, 1B and 2, it may be helpful to first establish definitions of the various devices mentioned in connection with the circuits. First, a field effect transistor of the enhancement type is a device which is normally "off" and which is rendered conductive when a positive threshold voltage is applied to its gate electrode. A field effect transistor of the depletion type is a device which is normally "on" with a negative threshold voltage applied to its gate electrodes. Finally, a natural field effect transistor is a non-inplanted device. Before substrate bias is applied, the device will have a slightly negative threshold voltage. When substrate bias is applied, the depletion region between the channel and bulk will get larger. Thus, a slight gate voltage may be required to turn the device on. It is not normally "on" as is the case with a depletion device. Ideally, a natural device has a zero volt threshold voltage. However, practically the threshold voltage may be slightly negative or slightly positive.

Referring to FIG. 1A, there is shown a known MOS input buffer circuit for receiving T²L logic level signals. The circuit comprises an input terminal or pad 2, and input protection device 4, first and second inverting amplifier stages, and a push pull stage. The first inverter stage includes a depletion device 8 and an enhancement device 6. Depletion device 8 has a drain electrode coupled to a source of supply voltage ($V_{DD}$) and has gate and source electrodes coupled to node 10. Enhancement device 6 has a drain electrode coupled to node 10, a gate electrode coupled to the output of input protection device 4, and a source electrode coupled to ground.

The second inverter stage includes enhancement device 12 and depletion device 14. The drain electrode of depletion device 14 is coupled to $V_{DD}$, and its gate and source electrodes are coupled to node 16. Enhancement device 12 has a gate electrode coupled to node 10, a drain electrode coupled to node 16 and a source electrode coupled to ground. The push pull stage includes natural device 20 and enhancement device 18. The drain of device 20 is coupled to $V_{DD}$, its gate electrode is coupled to node 16 and its source electrode is coupled to node 22. Enhancement device 18 has a gate electrode coupled to node 10, a drain electrode coupled to node 22 and a source electrode coupled to ground. The output of the circuit is taken off node 22 and is applied to subsequent stages.

Input protection device 4 may take any one of a variety of known forms, only one of which is shown in FIG. 1B. The input protection circuit shown in FIG. 1B includes a resistor 24, an enhancement field effect transistor 26 and a diode 28. Resistor 24 is coupled between input pad 2 and the gate of field effect transistor 6.

Enhancement device 26 has a gate and source electrode coupled to ground and a drain electrode coupled to the gate of device 6. Diode 28 has a cathode coupled to the gate of device 6 and an anode coupled to ground. Thus, an unwanted and unexpected positive voltage excursion will cause enhancement device 26 to break down (i.e. drain-to-source punch through) thus protecting the remainder of the circuit. Similarly, a negative excursion will forward bias diode 28. In each case, the current is limited by resistor 24.

The known circuit shown in FIG. 1A operates as follows. An input signal from the $T^2L$ circuitry is applied via terminal or pad 2 and input protection circuit 4 to the gate of field effect transistor 6. If this level corresponds to a high voltage, device 6 will be turned on causing a low voltage to be applied to node 10. Since node 10 is coupled to the gate of device 12, device 12 will remain in an off condition. Since depletion device 14 is normally on, a high voltage will appear at node 16. With a high voltage applied to the gate of natural device 20 and a low voltage applied to the gate of device 18, node 22 will go high.

In contrast, if the input signal at terminal 2 were low, device 6 would remain in an off condition. Since device 8 is normally on, a high voltage would appear at node 10 which is applied to the gates of devices 12 and 18. This causes devices 12 and 18 to turn on producing a low voltage at nodes 16 and 22.

As stated previously, a high input signal may be represented by a voltage as low as two volts. This voltage would be applied to the gate of device 6. If now there should be a variation in the supply voltage (for example, if $V_{DD}$ should increase above its normal 5 volt value), device 6 may not be able to sink all of the current being supplied to node 10 by device 8. Thus, device 6 may not be able to pull node 10 down to a logical low value. If node 10 is not pulled sufficiently low, the output appearing at node 22 would be an incorrect representation of the input signal.

The above and other problems are solved by the circuitry shown in FIG. 2. The circuit comprises an input terminal pad 2, input protection circuitry 4 (for example of the type shown in FIG. 1B), first, second and third inverting amplifier stages, and a feedback device 36. The first inverter stage includes enhancement devices 30 and 32. Enhancement device 30 has a gate coupled to the input signal, a source coupled to ground and a drain coupled to node 34. Device 32 has a source coupled to node 34 and a gate and drain electrode coupled to $V_{DD}$. Node 34 is coupled to the gate of device 40 in the second inverter stage. Device 40 also has a source coupled to ground and a drain coupled to node 39. Device 38 in the second inverter stage has a source coupled to node 39 and has drain and gate electrodes coupled to $V_{DD}$. Node 39 is also coupled to the gate of device 44 which has a source electrode coupled to ground and a drain electrode coupled to node 46. Device 42 in the third inverter stage is a depletion device having a drain coupled to $V_{DD}$ and having source and gate electrodes coupled to node 46. The output of the circuit is taken from node 46 and applied to subsequent stages. The circuit includes additionally a feedback enhancement field effect transistor 36 which has a gate electrode coupled to $V_{DD}$, a source electrode coupled to ground and a drain electrode coupled to node 34. It should be appreciated that the final stage of the circuit shown in FIG. 2 is an inverter stage whereas the final stage in the circuit shown in FIG. 1A is a push-pull stage. Therefore, the correct output at node 46 will be the complement of the input signal.

In normal operation, the circuit shown in FIG. 2 operates as follows. If a high voltage is applied to the gate of device 30, device 30 will turn on causing a low voltage to appear at node 34. This voltage is applied to the gate of device 40 maintaining in an off condition. Since the gate of device 38 is coupled to $V_{DD}$, device 38 will turn on causing a high voltage to appear at node 39. This high voltage is applied to the gate of device 44 turning it on causing a low voltage to appear at node 46.

If, on the other hand, a low voltage were applied to the gate of device 30, device 30 would be maintained in an off state. Since the gate of device 32 is coupled to $V_{DD}$, device 32 will turn on causing a high voltage to appear at node 34. This high voltage is applied to the gate of device 40 turning it on which results in a low voltage appearing at node 39. This low voltage at node 39 is applied to the gate of device 44 turning it off. Since depletion device 42 is normally on, a high voltage will appear at node 46.

As stated previously, a problem can arise when the input voltage representing a high logic level appearing at the output of input protection circuitry 4 is as low as two volts. If the supply voltage $V_{DD}$ should increase above its nominal value, device 30 may not be able to sink all the current flowing into node 34. This problem has been solved through the addition of enhancement device 36. As can be seen, the gate of device 36 is also coupled to the supply voltage. Therefore, if the supply voltage were to increase above its nominal value causing additional current to flow into node 34, the rise in the supply voltage would cause device 36 to turn on harder thus sinking the amount of current necessary to assure that node 34 drops to a low logic level. Device 36 is made very small (e.g. a channel width of 4 microns and a channel length of 4.5 microns) so as to render the device very sensitive to semiconductor processing variations. That is, processing variations which affect the dimensional resolution of devices 30, 32 and 36 will have a far greater effect on the conductivity of device 36 as compared to switching device 30.

To further improve the tracking qualities of the components in the first two inverter stages, both inverter stages are comprised entirely of enhancement devices. Thus, any process variations inherent in the fabrication of enhancement type devices will track in both the load and switching devices in each inverter stage. Finally, tracking is further enhanced by fabricating devices 30, 32, 38 and 40 such that their channel lengths are equal (e.g. 4 microns).

In summary, by controlling the gain of the first stage in FIG. 2 by means of device 36, the switch point can be rendered more stable than was the case with the known circuit. Further, by using only enhancement devices of equal channel length, the effects of process variations have been substantially reduced and the tracking characteristics of the individual components greatly enhanced.

The above description is given by way of example only. Changes in form and details may be made by one skilled in the art without departing from the scope of the invention as defined by the appended claims.

I claim:

1. An MOS input buffer circuit with compensation for process, supply voltage, and temperature variations, comprising:

a first amplifying stage coupled to a source of supply voltage and having a first input and a first output, said first input for receiving an input signal representative of high and low logic levels;

at least one additional amplifying stage coupled to said source and having a second input coupled to said first output and having a second output;

said first amplifying stage and said second amplifying stage comprising inverters each having at least two enhancement type semiconductor devices with substantially equal channel lengths to provide operating stability over temperature and process variations;

means coupled to said source and to said first amplifying stage comprising a field effect transistor having a channel width substantially equal to the channel width of a first semiconductor device of said first amplifying stage such that the conductivity of the field effect transistor tracks that of said first semiconductor device, for altering the gain of said first amplifying stage in response to fluctuations in said supply voltage; and wherein said field effect transistor has a gate electrode coupled to said source, a source electrode coupled to ground and a drain electrode coupled to the output of said first inverter.

2. A circuit according to claim 1 wherein said field effect transistor sinks a portion of the current supplied by said first semiconductor device, said portion being determined by said supply voltage, to compensate the switch point of the first amplifying stage for supply voltage variations.

* * * * *